United States Patent
Midya et al.

(10) Patent No.: US 9,054,937 B2
(45) Date of Patent: Jun. 9, 2015

(54) ENVELOPE EXTRACTION WITH REDUCED BANDWIDTH FOR POWER MODULATION

(75) Inventors: Pallab Midya, Palatine, IL (US); Joseph M. Ingino, Jr., Libertyville, IL (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/309,862

(22) Filed: Dec. 2, 2011

(65) Prior Publication Data
US 2012/0275544 A1    Nov. 1, 2012

Related U.S. Application Data
(60) Provisional application No. 61/480,876, filed on Apr. 29, 2011.

(51) Int. Cl.
| | | |
|---|---|---|
| H04K 1/02 | (2006.01) | |
| H04L 27/38 | (2006.01) | |
| H03F 1/02 | (2006.01) | |
| H03F 3/24 | (2006.01) | |

(52) U.S. Cl.
CPC ............ *H04L 27/3809* (2013.01); *H03F 1/025* (2013.01); *H03F 3/24* (2013.01); *H03F 2200/102* (2013.01); *H03F 2200/435* (2013.01)

(58) Field of Classification Search
CPC ........... H04L 27/03; H03F 1/025; H03F 3/24; H03F 2200/102
USPC .................................... 375/295, 297; 455/127
See application file for complete search history.

(56) References Cited

U.S. PATENT DOCUMENTS
| | | | |
|---|---|---|---|
| 6,074,775 A | | 6/2000 | Garstein et al. |
| 6,242,975 B1 * | | 6/2001 | Eidson et al. ............. 330/124 R |
| 6,480,236 B1 * | | 11/2002 | Limberg ........................ 348/555 |
| 7,638,991 B1 | | 12/2009 | Kobayashi |
| 7,706,467 B2 * | | 4/2010 | Kenington .................... 375/296 |
| 7,715,810 B2 * | | 5/2010 | Brobston .................... 455/114.2 |
| 8,031,804 B2 * | | 10/2011 | Sorrells et al. ................ 375/297 |

(Continued)

FOREIGN PATENT DOCUMENTS
CN    101795463    8/2010

OTHER PUBLICATIONS
Pallab Midya et al., Tracking Power Converter for Supply Modulation of RF Power Amplifiers, Power Electronics Specialists Conference, 2001, IEEE 32nd Annual, pp. 1540-1545.

(Continued)

*Primary Examiner* — Daniel Washburn
*Assistant Examiner* — Berhanu Tadese
(74) *Attorney, Agent, or Firm* — Grossman Tucker Perreault & Pfleger PLLC

(57) ABSTRACT

A system according to one embodiment includes a digital data modulator configured to generate encoded symbols; an envelope detector configured to receive the encoded symbols and to estimate transmission power information associated with the encoded symbols; a peak detector configured to receive the transmission power information, detect a peak transmission power from two or more sequential data points of the received transmission power information, and to generate a power regulation signal representative of the detected peak transmission power; and a digital to analog converter (DAC) configured to receive the power regulation signal and to provide a reference voltage to a power supply associated with an RF amplifier.

11 Claims, 5 Drawing Sheets

(56) References Cited

U.S. PATENT DOCUMENTS

| | | | |
|---|---|---|---|
| 8,457,246 B2* | 6/2013 | Kim et al. | 375/295 |
| 8,542,061 B2 | 9/2013 | Levesque et al. | |
| 2002/0071497 A1* | 6/2002 | Bengtsson et al. | 375/298 |
| 2003/0107412 A1* | 6/2003 | Melsa | 327/108 |
| 2004/0001586 A1* | 1/2004 | Melsa et al. | 379/399.01 |
| 2004/0071225 A1* | 4/2004 | Suzuki et al. | 375/297 |
| 2006/0128324 A1* | 6/2006 | Tan et al. | 455/127.1 |
| 2006/0209984 A1* | 9/2006 | Kenington | 375/297 |
| 2009/0004981 A1* | 1/2009 | Eliezer et al. | 455/127.1 |
| 2010/0001704 A1 | 1/2010 | Williams | |
| 2010/0156368 A1 | 6/2010 | Huynh et al. | |
| 2010/0295613 A1* | 11/2010 | Asbeck et al. | 330/149 |
| 2011/0031953 A1* | 2/2011 | Kanbe et al. | 323/311 |
| 2011/0058601 A1* | 3/2011 | Kim et al. | 375/238 |
| 2011/0086600 A1* | 4/2011 | Muhammad | 455/120 |
| 2011/0285460 A1* | 11/2011 | Murao | 330/124 R |
| 2012/0229110 A1 | 9/2012 | Huang et al. | |
| 2012/0313701 A1* | 12/2012 | Khlat et al. | 330/127 |
| 2013/0072139 A1* | 3/2013 | Kang et al. | 455/114.3 |

OTHER PUBLICATIONS

Pallab Midya et al., Buck or Boost Tracking Power Converter, Dec. 2004, pp. 131-134, vol. 2, No. 4.

Simulink Communication Simulation Development Manual, Oct. 2004, 4 pages, National Defense Industry Press (Original Chinese with English Translation).

* cited by examiner

US 9,054,937 B2

ENVELOPE EXTRACTION WITH REDUCED BANDWIDTH FOR POWER MODULATION

This application claims the benefit of U.S. Provisional Application No. 61/480,876, filed Apr. 29, 2011, which is incorporated by reference herein in its entirety.

FIELD

The present disclosure relates to the extraction of an RF envelope, and more particularly, to the extraction of an RF envelope for transmit power modulation using a reduced bandwidth approach.

BACKGROUND

Envelope following has been used in lower bandwidth systems to modulate the supply power of radio frequency (RF) power amplifiers to save power. These systems may be limited, however, by the requirement that the power switching frequency substantially exceed the bandwidth of the RF envelope. In the case of newer communication standards such as long term evolution (LTE) and Wideband Code Division Multiple Access (WCDMA), maintaining the switching frequency above the RF bandwidth may not be practical. Switching frequency is typically limited to about 6 megahertz (MHz), whereas the RF envelope bandwidth for LTE, for example, is about 20-40 MHz. To track an LTE bandwidth envelope using existing methods and apparatus can require a switching frequency greater than 60 MHz. For example, generation of an envelope in the digital domain and conversion to analog with a digital-to-analog converter (DAC) can require increased silicon die area and power comsumption due to the higher data rate and bandwidth associated with the envelope. This can limit design flexibility and options for newer RF communication standards such as third generation (3G), fourth generation (4G), and other future RF applications because these higher bandwidth, higher frequency DAC implementations can exceed power budgets.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

DETAILED DESCRIPTION

Figure 1:
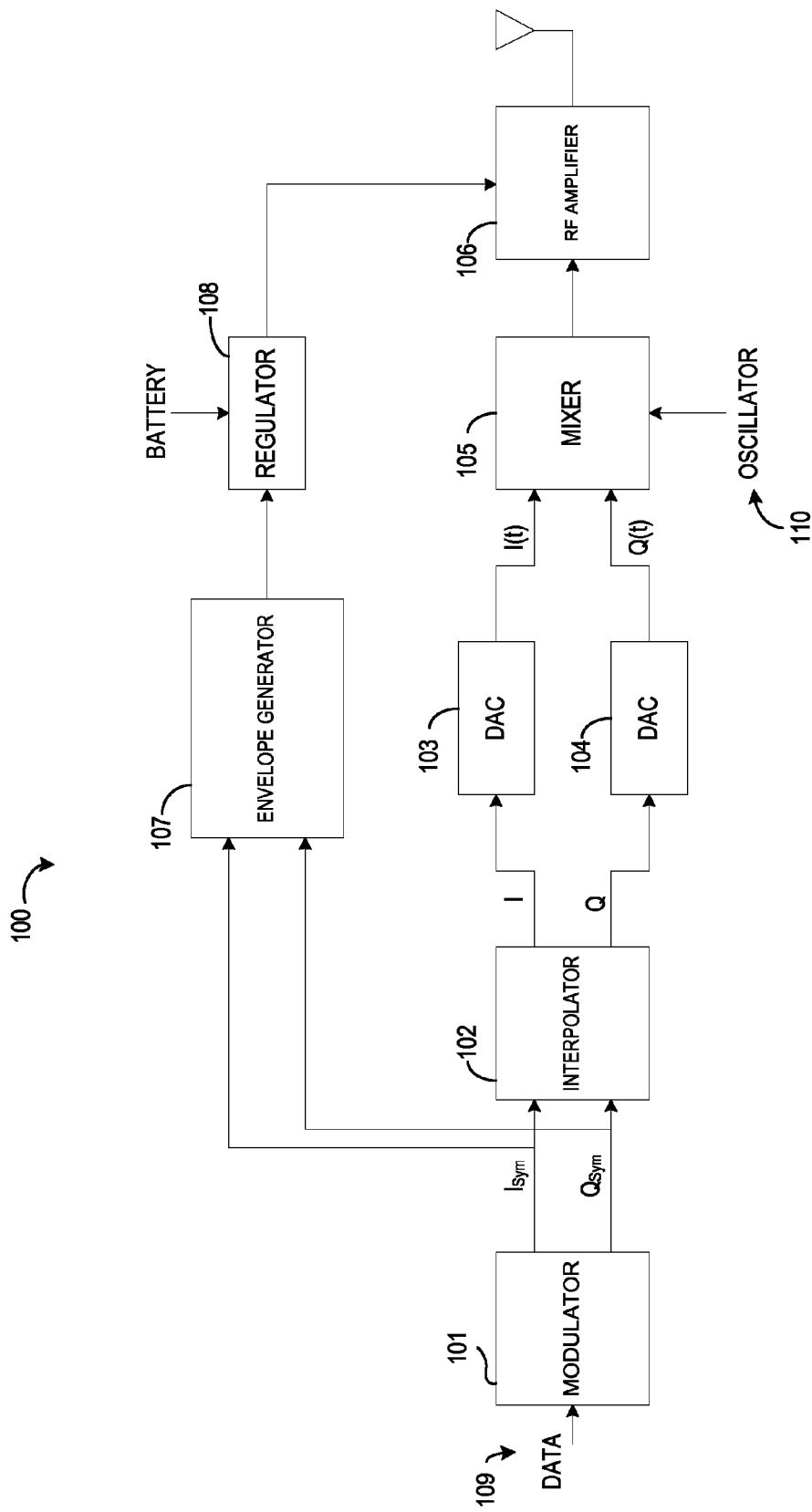
FIG. 1 illustrates a block diagram of one exemplary embodiment of a wireless transmission system consistent with the present disclosure.

Generally, this disclosure provides systems and methods to extract and track a higher bandwidth RF envelope using a lower bandwidth estimation approach with increased power efficiency. The estimated envelope may be used to regulate the supply voltage to an RF power amplifier. In some embodiments, more efficient modulation of RF power amplifiers in higher bandwidth systems, such as LTE, WCDMA, etc., can be realized. Efficient power modulation may advantageously extend the life between charge operations of devices such as cell phones or other mobile communication devices.

Power supply modulation based on envelope tracking may be used in systems with higher peak to average quadrature modulation, such as quadrature amplitude modulation (QAM). Extracting the envelope from the full RF waveform in such systems may be accomplished using a higher bandwidth and, therefore, a higher power, implementation. However, for mobile electronic devices, the power used to detect and track the bandwidth may be counterproductive as detecting and tracking the bandwidth can use more power than may be saved by modulating the supply power to the RF power amplifier using the higher-frequency, higher-bandwidth detection and tracking scheme.

In an embodiment of the present disclosure, systems and methods may take advantage of the slower symbol data rates in some quadrature modulation systems, such as QAM. QAM modulation encodes digital information by periodically adjusting the phase and amplitude of a sinusoidal electromagnetic wave. Each combination of phase and amplitude is called a symbol and represents a digital bit stream pattern. The lower symbol data rate and corresponding lower amplitudes allow an approximation of the envelope using a small look-up table. In some embodiments, amplitudes of just a few samples may be combined to generate an envelope having a lower data rate and lower bandwidth. This lower-bandwidth, lower-frequency (LF) envelope is an approximation of the actual RF envelope and may be converted to an analog signal using a lower bandwidth DAC. In some embodiments, the lower bandwidth may allow the LF envelope to be tracked using a lower bandwidth, more efficient DC-DC power supply regulator to provide supply voltage to an RF power amplifier at a level sufficient to communicate the data stream without substantial distortion or clipping.

In some embodiments, the LF envelope may be generated using a digital circuit of reduced size and a DAC inside a digital base band or transceiver IC. In some embodiments, using the LF envelope may avoid the need for a high-bandwidth tracking DAC and can allow a tracking power converter with lower tracking bandwidth to take the DAC output and provide a modulated supply voltage for the RF power amplifier. The supply voltage may be modulated based on the detected bandwidth such that the RF power amplifier transmits using just enough power to communicate without substantially clipping or otherwise distorting the transmitted signal. Such modulation may significantly extend the operational interval between charging events of electronic devices that rely on a limited power source, such as a battery.

FIG. 1 illustrates a block diagram 100 of one exemplary embodiment of a wireless transmission system consistent with the present disclosure. Shown are a modulator 101, an interpolation module 102, an in phase (I) channel DAC 103, a quadrature (Q) channel DAC 104, a mixer 105, an RF amplifier 106, an envelope generator 107, and a power supply regulator 108, such as a DC-to-DC converter. The modulator 101, such as a QAM modulator, may receive a data stream 109 to be transmitted and encode the data stream 109 into symbols $I_{Sym}$, $Q_{Sym}$, representing the in-phase and quadrature-phase components respectively. The symbols $I_{Sym}$, $Q_{Sym}$ may represent bit patterns within the data stream. For example, for 16-QAM modulation, each symbol $I_{Sym}$, $Q_{Sym}$ may represent a combination of four bits within the data stream 109. In a 64-QAM modulator, each symbol $I_{Sym}$, $Q_{Sym}$ may represent 6 bits within the data stream 109. Other modulation schemes are possible without departing from the scope of the present subject matter. The QAM symbols $I_{Sym}$, $Q_{Sym}$ may represent an amplitude and phase of the two carrier waves I(t), Q(t) used to modulate the data stream 109. The interpolator 102 maps the symbols $I_{Sym}$, $Q_{Sym}$ to a complex plane and then up-samples and interpolates to provide smooth transitions between sequential symbols. The up-sampled data for each carrier signal may be represented as I and Q. The up-sampled data I, Q may be converted to analog values using the I DAC 103 and the Q DAC 104. The mixer 105 mixes the signals using a local oscillator 110 to provide a modulated signal, such as a modulated radio frequency signal, to a power amplifier 106 for transmission.

In some embodiments, an envelope generator 107 monitors the data stream 109 and estimates power to transmit the data stream. The estimated power information may be used to provide a reference signal to a regulator 108 to regulate supply voltage to the RF amplifier 106, such that the RF amplifier 106 may be provided with a minimum amount of power to properly transmit the data stream. For example, certain patterns of data may be transmitted with less power than other patterns of data. As discussed below, the modulator symbols $I_{Sym}$, $Q_{Sym}$ may be used to identify bit patterns of the data stream 109 and a lookup table may be used to estimate the supply power needed to properly transmit the data stream 109 using the RF amplifier 106. Modulating the transmission power of the RF amplifier according to the requirements of the particular bit patterns being transmitted may save a substantial amount of energy over the charge life of an electronic device, such as a mobile electronic device. Modulating the transmission power of the RF amplifier may also provide thermal savings that can reduce stress on the RF amplifier and extend the life of the RF amplifier as well as other components absorbing heat from the RF amplifier.

Figure 2:
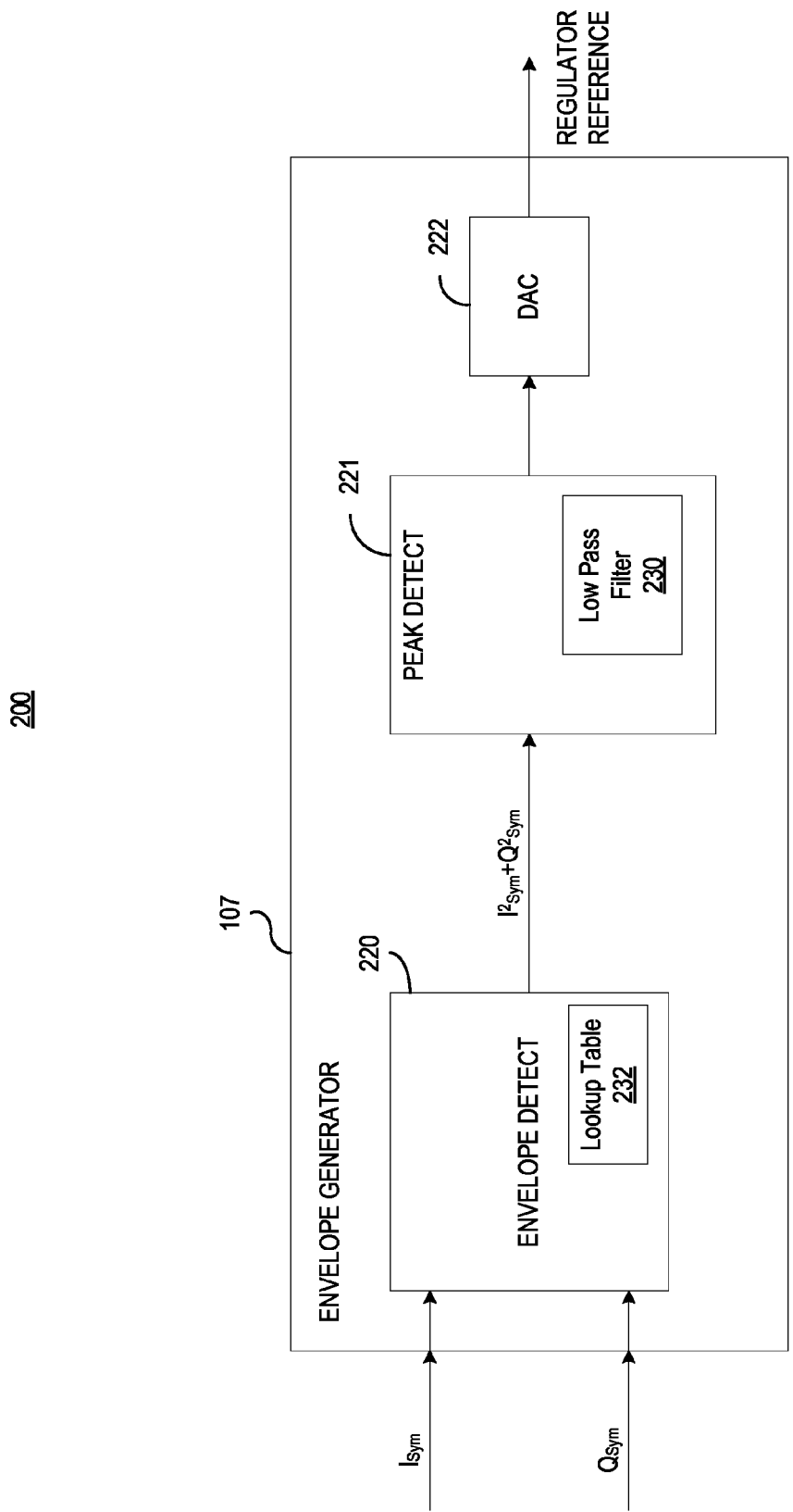
FIG. 2 illustrates a block diagram of one exemplary embodiment of an envelope generator consistent with the present disclosure.

FIG. 2 illustrates a block diagram 200 of one exemplary embodiment of envelope generator 107 consistent with the present disclosure. Envelope generator 107 includes an envelope detector 220 and a peak detector 221. The envelope detector 220 receives the digital symbols $I_{Sym}$, $Q_{Sym}$ from the transmission system and computes the power envelope associated with the encoded bit patterns. The envelope detector 220 then sums the squares of the symbols $I_{Sym}$, $Q_{Sym}$ to estimate the power envelope information. The power detector may estimate transmission power information, including a low-frequency (LF) power envelope, using the square root of the sum of the squares of the symbols, e.g. $\sqrt{(I_{Sym}^2+Q_{Sym}^2)}$. Each of these values is band limited. In some embodiments, the values defining the LF power envelope may be represented by a lookup table 232 to reduce the computation power put forth in computing and tracking the LF power envelope. The lookup table 232 may be indexed by the symbols $I_{Sym}$, $Q_{Sym}$. In some embodiments, potential power values of the LF envelope may be combined where those values are close to one another, thus further reducing the size of a lookup table 232 and easing the computational effort in detecting and tracking the LF envelope. The peak detector 221 receives the LF envelope information from the power detector 220 and provides power information to a power reference DAC 222. In some embodiments, the peak detector may implement a digital maximum function of a number of successive samples. In some embodiments, the digital maximum function may be substituted by another suitable non-linear function. The number of successive samples can be a programmable parameter used to optimize power savings. The peak detector 221 may detect a peak power using a number of sequential samples from the LF envelope information. For example, the peak detector can update the power information using 10 sequential data points of the LF envelope information. It is understood the other quantities of data points of the LF envelope may be used to detect peaks in the LF envelope and update the power information to the power reference DAC 222. The peak detector may also employ a low pass filter 230 to further smooth and reduce the bandwidth of the power information supplied to the power DAC 222. In some embodiments, the power DAC 222 may provide a reference to a power supply or power regulator 108, such as a DC-DC converter, to provide supply voltage to the RF power amplifier 106 for transmitting the data stream 109 received at the modulator 101.

Figure 3:
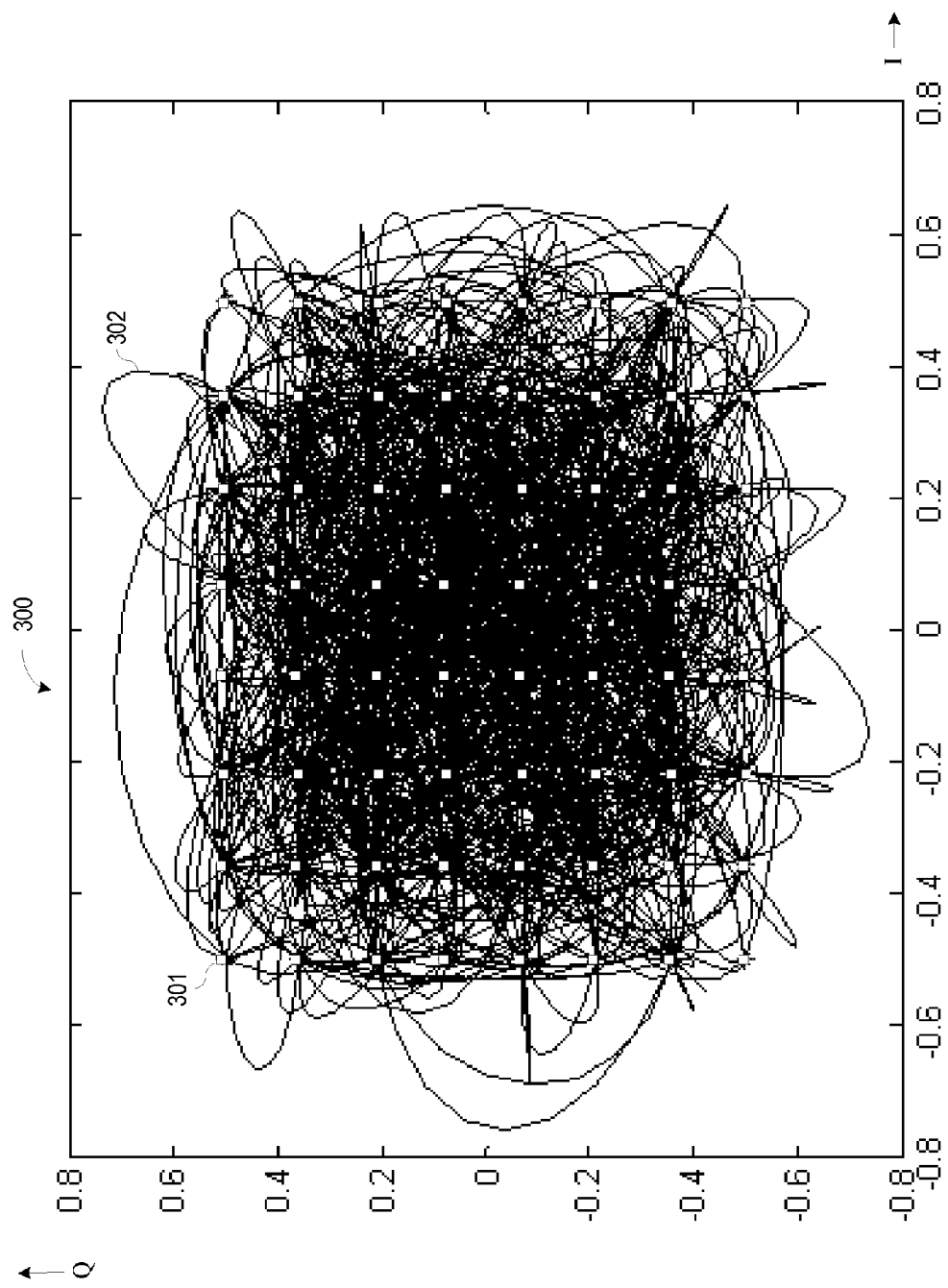
FIG. 3 illustrates a constellation diagram consistent with one exemplary embodiment of the present disclosure.

FIG. 3 illustrates a constellation diagram 300 consistent with one exemplary embodiment of the present disclosure. An example constellation diagram of 64-QAM symbols and possible transitions paths of a data stream encoded by a 64-QAM modulator are shown. Each symbol may be represented by a symbol point in the constellation 300. Each symbol point can be associated with a pattern of 6 binary digits. In the illustrated constellation 300, the symbol points are arranged in an 8×8 array and each symbol point is illustrated with a small square, such as square 301. Associated with each point is an amplitude, A, and angle, θ, referenced to the origin of the constellation, such that, in an example modulator, $I_{Sym}$=A cos (θ), and $Q_{Sym}$=A sin (θ). The constellation 300 of FIG. 3 includes a transition path 302 between symbol points. Following the transition path 302 can provide an indication of the bit pattern associated with a data stream. The up-sampling discussed above can be used to smooth the transition path 302 between successive symbol points by interpolating the transition path 302 as each successive symbol of the data stream is determined. It is understood that other digital modulation techniques are possible without departing from the scope of the present subject matter, for example, other QAM modulation techniques that modulate more or less bits into each symbol.

Figure 4:
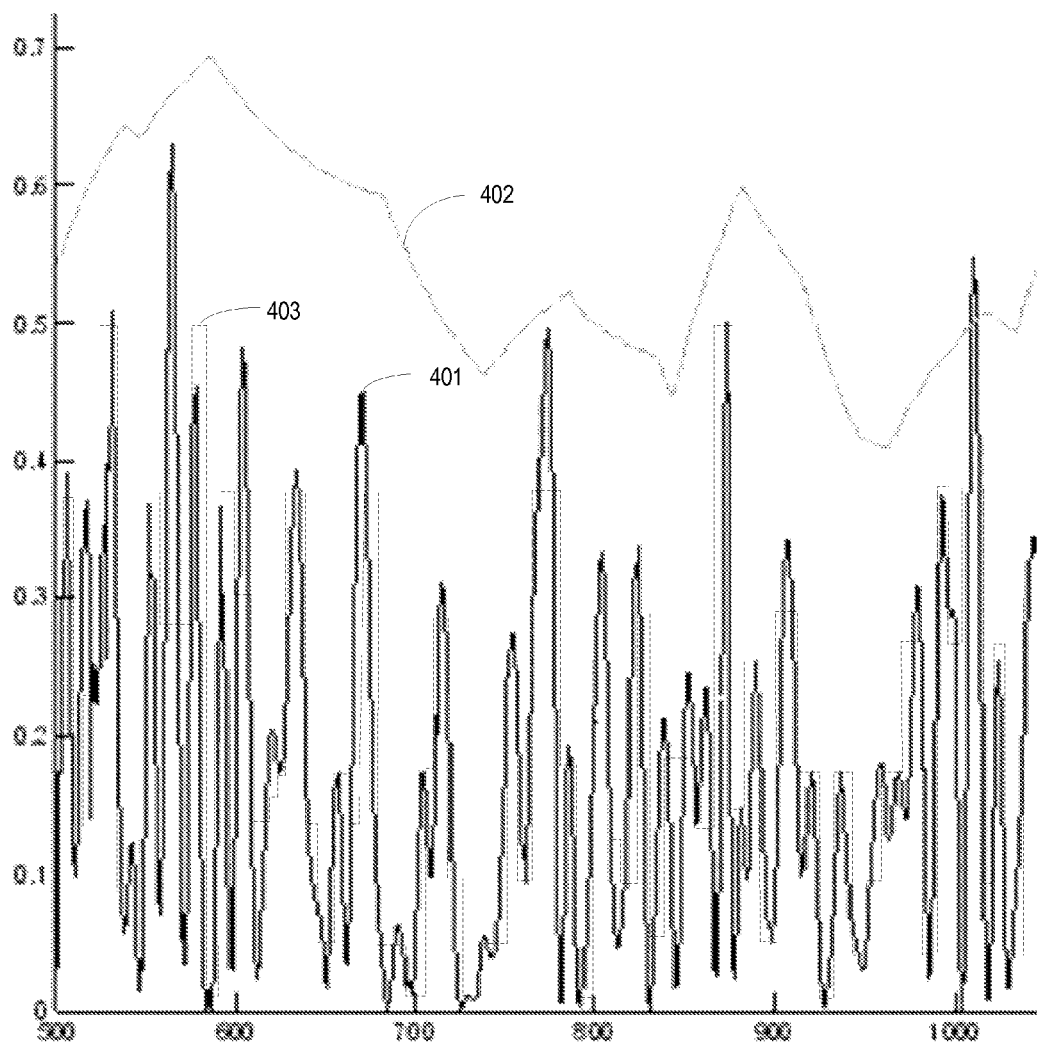
FIG. 4 illustrates power envelopes consistent with one exemplary embodiment of the present disclosure.

FIG. 4 illustrates power envelopes 400 consistent with one exemplary embodiment of the present disclosure. Shown is a relationship between a high frequency power envelope 401 and the LF envelope 402 generated by an example LF envelope generator. The plot illustrates the high frequency power envelope 401 associated with transmitting a data stream. The high frequency power envelope 401 includes rapid changes between peaks of the power envelope. The plot also illustrates an envelope detect output signal 403, such as the output signal of the envelope detect 220 of FIG. 2. In contrast, the LF envelope generator can estimate a power envelope 402 using low frequency techniques, such as peak detection and low pass filtering of an envelope detector, that maximize efficient power regulation to the power amplifier while conserving computational resources used to detect and track the power envelope of a particular data stream.

Figure 5:
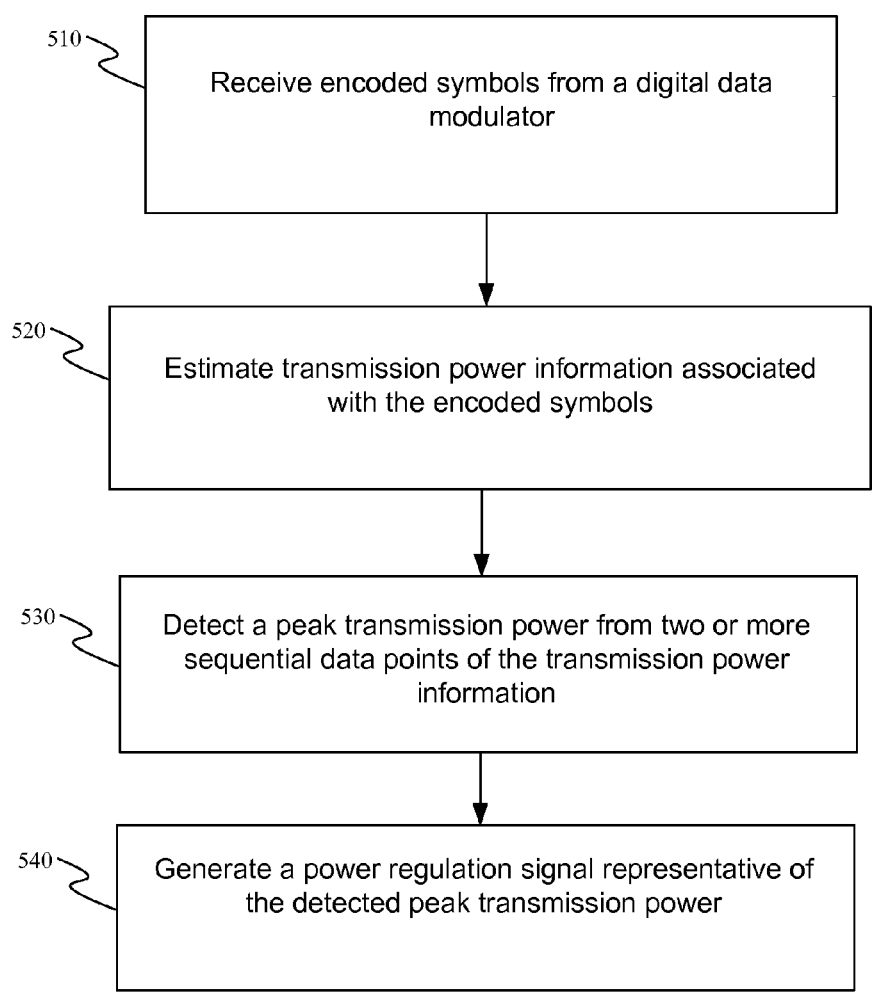
FIG. 5 illustrates a flowchart of operations of one exemplary embodiment consistent with the present disclosure Although the following Detailed Description will proceed with reference being made to illustrative embodiments, many alternatives, modifications, and variations thereof will be apparent to those skilled in the art.

FIG. 5 illustrates a flowchart of operations 500 of one exemplary embodiment consistent with the present disclosure. At operation 510, encoded symbols are received from a digital data modulator. In some embodiments, the encoded symbols may be in-phase and quadrature components of a QAM modulated signal. At operation 520, estimation is made of the transmission power information associated with the encoded symbols. The estimation may be performed with the aid of a lookup tables indexed by encoded symbols. At operation 530, peak transmission power is detected from two or more sequential data points of the transmission power information. At operation 540, a power regulation signal representative of the detected peak transmission power is generated.

Embodiments of the methods described herein may be implemented in a system that includes one or more storage mediums having stored thereon, individually or in combination, instructions that when executed by one or more processors perform the methods. Here, the processor may include, for example, a system CPU (e.g., core processor) and/or programmable circuitry. Thus, it is intended that operations according to the methods described herein may be distributed across a plurality of physical devices, such as processing structures at several different physical locations. Also, it is intended that the method operations may be performed individually or in a subcombination, as would be understood by one skilled in the art. Thus, not all of the operations of each of the flow charts need to be performed, and the present disclosure expressly intends that all subcombinations of such operations are enabled as would be understood by one of ordinary skill in the art.

The storage medium may include any type of tangible medium, for example, any type of disk including floppy disks, optical disks, compact disk read-only memories (CD-ROMs), compact disk rewritables (CD-RWs), digital versatile disks (DVDs) and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of media suitable for storing electronic instructions.

"Circuitry", as used in any embodiment herein, may comprise, for example, singly or in any combination, hardwired circuitry, programmable circuitry, state machine circuitry, and/or firmware that stores instructions executed by programmable circuitry.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. An apparatus, comprising:
   an envelope detector configured to receive quadrature amplitude modulated (QAM) constellation symbols from a digital data modulator, and to generate transmission power information based on estimated signal envelope values retrieved from a lookup table, wherein said lookup table is indexed by the in-phase and quadrature components of said QAM constellation symbols; and
   a peak detector configured to receive said transmission power information, detect a peak transmission power from two or more sequential data points of said received transmission power information, the number of sequential data points determined based on a programmable parameter used to optimize power savings, and to provide a power regulation signal representative of said detected peak transmission power.

2. The apparatus of claim 1, further comprising a low pass filter to reduce the bandwidth of said transmission power information.

3. The apparatus of claim 1, wherein said peak detector is further configured to perform a digital maximum operation on a subset of said sequential data points of said received transmission power information.

4. The apparatus of claim 1, further comprising a digital to analog converter (DAC) configured to receive said power regulation signal and to provide a reference voltage to a power supply associated with an RF amplifier.

5. A method, comprising:
   receiving quadrature amplitude modulated (QAM) constellation symbols from a digital data modulator;
   retrieving estimated signal envelope values from a lookup table, wherein said lookup table is indexed by the in-phase and quadrature components of said QAM constellation symbols;
   generating transmission power information based on said estimated signal envelope;
   detecting a peak transmission power from two or more sequential data points of said transmission power information, the number of sequential data points determined based on a programmable parameter used to optimize power savings; and
   generating a power regulation signal representative of said detected peak transmission power.

6. The method of claim 5, further comprising low pass filtering to reduce the bandwidth of said transmission power information.

7. The method of claim 5, further comprising performing a digital maximum operation on a subset of said sequential data points of said received transmission power information.

8. The method of claim 5, further comprising configuring a digital to analog converter (DAC) to receive said power regulation signal and to provide a reference voltage to a power supply associated with an RF amplifier.

9. A system, comprising:
   a digital data modulator configured to generate quadrature amplitude modulated (QAM) constellation symbols;
   an envelope detector configured to receive said QAM constellation symbols and to generate transmission power information based on estimated signal envelope values retrieved from a lookup table, wherein said lookup table is indexed by the in-phase and quadrature components of said QAM constellation symbols;
   a peak detector configured to receive said transmission power information, detect a peak transmission power from two or more sequential data points of said received transmission power information, the number of sequential data points determined based on a programmable parameter used to optimize power savings, and to generate a power regulation signal representative of said detected peak transmission power; and
   a digital to analog converter (DAC) configured to receive said power regulation signal and to provide a reference voltage to a power supply associated with an RF amplifier.

10. The system of claim 9, further comprising a low pass filter to reduce the bandwidth of said transmission power information.

11. The system of claim 9, wherein said peak detector is further configured to perform a digital maximum operation on a subset of said sequential data points of said received transmission power information.

* * * * *